United States Patent
Kim

(10) Patent No.: US 7,022,009 B2
(45) Date of Patent: Apr. 4, 2006

(54) AIR CLEANING SYSTEM FOR SEMICONDUCTOR MANUFACTURING EQUIPMENT

(75) Inventor: Jong-Ok Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/984,823

(22) Filed: Nov. 10, 2004

(65) Prior Publication Data

US 2005/0113017 A1    May 26, 2005

(30) Foreign Application Priority Data

Nov. 11, 2003   (KR)   .................... 10-2003-0079330

(51) Int. Cl.
*F24F 3/16*   (2006.01)

(52) U.S. Cl. ...................................... 454/187; 414/935

(58) Field of Classification Search ................ 454/187; 414/935, 937, 938, 940

See application file for complete search history.

(56) References Cited

U.S. PATENT DOCUMENTS

| 5,008,558 | A | 4/1991 | Koshinaka et al. |
| 5,328,555 | A | 7/1994 | Gupta |
| 5,459,569 | A | 10/1995 | Knollenberg et al. |
| 5,910,727 | A * | 6/1999 | Fujihara et al. .......... 324/158.1 |
| 6,476,393 | B1 | 11/2002 | Yoshida et al. |
| 2002/0062702 | A1 | 5/2002 | Bradley |
| 2002/0163637 | A1 | 11/2002 | Rossman et al. |
| 2003/0047012 | A1 | 3/2003 | Storbeck et al. |

FOREIGN PATENT DOCUMENTS

JP            401136346 A  *  1/1989

* cited by examiner

*Primary Examiner*—Harold Joyce
(74) *Attorney, Agent, or Firm*—Volentine Francos & Whitt PLLC

(57) ABSTRACT

A cleaning system for n semiconductor manufacturing equipment includes a working area and a service area. A wafer process area in the service area performs a semiconductor manufacturing process. A wafer transfer area is spatially connected to the wafer process area, and transfers a wafer from the working area to the wafer process area. An air supply device supplies clean air to the wafer transfer area and the wafer process area. A particle measurer continuously checks for any malfunction or defect of the air supply device, and measures in real time an impurity particle count of the air in the wafer transfer area so as to detect any abnormally high pollution level in the wafer transfer area.

10 Claims, 5 Drawing Sheets

AIR CLEANING SYSTEM FOR SEMICONDUCTOR MANUFACTURING EQUIPMENT

CROSS REFERENCES TO RELATED APPLICATIONS

This application claims priority under 35 U.S.C. §119 from Korean Patent Application 2003-79330, filed on Nov. 11, 2003, the contents of which are hereby incorporated by reference in their entirety for all purposes as if fully set forth herein.

BACKGROUND AND SUMMARY

1. Technical Field

The present invention relates to semiconductor manufacturing equipment, and more particularly, to an air cleaning system for controlling impurity or pollution particles in the air within a clean room.

2. Description

Recently, research to prevent process defects in a semiconductor wafer manufacturing process, and to increase the production yield, is being actively pursued in conformity with the rapid development of semiconductor devices. It is being inevitably required to increase the degree to which air within a clean room is cleaned, which greatly influences an improvement in the production yield of the semiconductor devices. The clean room is provided as a space independent and isolated from a peripheral or surrounding environment, to produce a nearly-pollution-free environment by eliminating impurity or pollution particles typically existing in air.

FIG. 1 is a plan view schematically illustrating a conventional clean room, and the directions of the arrows indicate the air flow direction therein.

Referring to FIG. 1, a clean room 1 is isolated from the outside to independently control temperature and humidity therein. Clean air, having had undesirable impurity or pollution particles removed therefrom, circulates in the clean room 1. The clean room 1 is largely classified into a working area 5 and a service area 3.

The working area 5 is also called a bay, and a boat, having wafers mounted therein is disposed inside and is moved therein by a worker or robot. The service area 3 contains a unit process region where semiconductor equipment is positioned for performing various processes on the wafer after it is returned from the working area 5. The unit process region includes a wafer process area 7 performing some processes or operations on the wafer, and a wafer transfer area 9 for loading and unloading the wafer from the wafer process area 7.

The boat having the wafers mounted therein is moved from the working area 5 to the wafer transfer area 9 by a worker, and then a robot of the wafer transfer area 9 loads the wafers onto a wafer stage one by one and also unloads the process-completed wafers from the wafer process area 7.

The clean room 1 is designed so as not to cause an air inflow from the outside by maintaining the air pressure inside to be higher than the atmospheric pressure, and is controlled so that the air pressure of the working area 5 is higher than that of the service area 3. This pressure difference prevents microparticles generated in the service area 3 from flowing into the working area 5 provided as the wafer movement area. The pressure difference is obtained by controlling the amount of clean air flowing between the working area 5 and the service area 3.

FIG. 2 is an elevation view along line I~I' in FIG. 1. With reference to FIG. 2, in an upper part of the clean room 1 an upper plenum 11 is provided to supply primarily purified clean air, and in a lower part of the clean room 1 a lower plenum 13 opposite to the upper plenum 11 is formed to collect the air passed through the clean room 1.

The clean air supplied from the upper plenum 11 is passed through a first air filter 15, and is then passed through the working area 5 and the service area 3, and simultaneously the particles generated in the working area 5 and the service area 3 are discharged together with the clean air through the lower plenum 13 maintaining a low pressure. The working area 5 and the service area 3 are isolated vertically and independently from each other, by the first air filter 15 and a grating 17 that has air holes through which air is passed, the first air filter 15 being adapted to remove particles from air in the upper and lower plenums.

The volume of clean air flowing in the working area 5 and the service area 3 is controlled by the size of the first air filter 15 and the number of gratings 17, or the number of air holes, etc.

Though not shown in the drawing, the air collected from the lower plenum 13 is recirculated back to the upper plenum 11 by using a specific blast unit (e.g., a fan). At least one particle measurer is installed in the working area 5, and is managed to have and maintain in the working area 5 air that is cleaner and more purified than in the service area 3.

Also, air that is even cleaner and more purified than in the service area 3 and the working area 5 is supplied to the wafer process area 7 and the wafer transfer area 9 by using an air supply device 19 (see FIG. 3) for additionally (secondarily) purifying the clean air supplied from the service area 3 and the working area 5.

FIG. 3 illustrates in greater detail the wafer process area 7 and the wafer transfer area 9 shown in FIG. 2.

Referring to FIG. 3, the air supply device 19 includes a second air filter 19a and an air blast (e.g., fan) 19b, and sucks and purifies air of the working area 5 or the service area 3, then supplies it to the wafer process area 7 and the wafer transfer area 9. In some cases, air input to the air supply device 19 may be supplied from the lower plenum 13, and the air supply device 19 itself may be positioned within the lower plenum 13.

Furthermore, in the system of FIG. 3, an ion implantation device 21 is installed in the wafer process area 7, and a robot 27 is provided in the wafer transfer area 9. The robot 27 is adapted to remove a wafer from the boat 23 transferred from the working area 5, and to load the wafer into the wafer process area 7 through a wafer gate 25. The robot 27 not only loads the wafer from the boat 23 to the working area 5, but also unloads the completed wafer from the working area 5 and returns it to the boat 23 after completion of an ion implantation process of the ion implantation device 21.

The bottom of the wafer process area 7 and the wafer transfer area 9 is closed by a wall body so as not to directly discharge the clean air supplied from the air supply device 19 to the lower plenum 13. A plurality of pedestals 31 are installed within the lower plenum 13 for supporting the clean room 1 containing the wafer process area 7 and the wafer transfer area 9.

Thus, the wafer process area 7 and the wafer transfer area 9 maintain pressure relatively higher than the service area 3 and the working area 5, by the clean air supplied from the air supply device 19. Therefore, the clean air supplied to the wafer process area 7 and the wafer transfer area 9 flows dispersedly to the working area 5 and/or the service area 3.

That is, the air flow between the wafer transfer area 9 and the working area 5 can be performed through a gap of the boat gate 29 through which the boat 23, having the numerous wafers mounted therein, passes, or through a gap formed in the periphery of a door 32 that is installed in the wafer gate 25. Meanwhile, air flow between the wafer process area 7 and the service area 3 is performed through microapertures or openings formed in the wall body.

An air filter of the air supply device 19 for supplying the clean air to the wafer process area 7 and the service area 3 should be exchanged periodically after the lapse of a predetermined fixed time interval. Meanwhile, a worker should regularly measure the air impurity level, or degree of cleanliness, of the air in the wafer process area 7 and the wafer transfer 9, and should exchange the second air filter 19a of the air supply device 19 with a new one when the air impurity level exceeds a predetermined fixed threshold.

In the conventional air cleaning system for semiconductor manufacturing equipment, a worker regularly measures the particle pollution state of the wafer transfer area 9, and the second air filter 19a should be exchanged with a new one periodically after a lapse of a predetermined fixed time interval.

However, the conventional air cleaning system for semiconductor manufacturing equipment has the following disadvantages.

First, the conventional air cleaning system for semiconductor manufacturing equipment generates a defect in an ion implantation process if the wafer transfer area 9 is polluted with particles due to a pollution of the second air filter of the air supply device 19. This defect can be discovered in a product test procedure after the lapse of time or after the completion of the semiconductor manufacturing process. That is, there is a disadvantage that the yield of the ion implantation process declines.

Secondly, in order to sense abnormal metallic particles generated from a dynamic factor such as the robot 27 for loading or unloading a wafer on/from the wafer transfer area 9, in the conventional air cleaning system for semiconductor manufacturing equipment a maintenance worker must be continuously stationed to manage the clean room 1. Otherwise, the productivity may decrease due to an efficiency decrease of production in case the worker takes too long to eliminate contamination of the wafer transfer area 9 caused by the pollution particles.

Accordingly, it would be desirable to provide an air cleaning system for semiconductor manufacturing equipment which is capable of monitoring in real-time the generation of particle pollution in a wafer transfer area, and is capable of increasing the production yield by preventing the particle pollution.

According to one aspect of the present invention, a semiconductor manufacturing system comprises a working area; and a service area, the service area comprising: a wafer process area, in which a semiconductor manufacturing process is performed; a wafer transfer area spatially connected to the wafer process area, the wafer transfer area being adapted to transfer a wafer from the working area to the wafer process area; an air supply device for supplying clean air to the wafer transfer area and the wafer process area; and a particle measurer adapted to measure in a real time an impurity particle count of air in the wafer transfer area.

Herewith, the wafer process area executes a semiconductor manufacturing process in the service area. The wafer transfer area is spatially connected to the wafer process area, and transfers a wafer from the working area to the wafer process area. The air supply device supplies clean air to the wafer transfer area and the wafer process area. The particle measurer detects a defect of the air supply device, and continuously measures a degree of air cleanliness in the wafer transfer area so as to sense a particle pollution abnormally generated in the wafer transfer area.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

Hereinafter, exemplary embodiments of the present invention will be described in detail with reference to FIGS. 4 to 7 in which like components having like functions have been provided with like reference symbols and numerals. It will be understood by those skilled in the art that the present invention can be embodied by numerous different types and is not limited to the following described embodiments. The following various embodiments are exemplary in nature.

Figure 1:
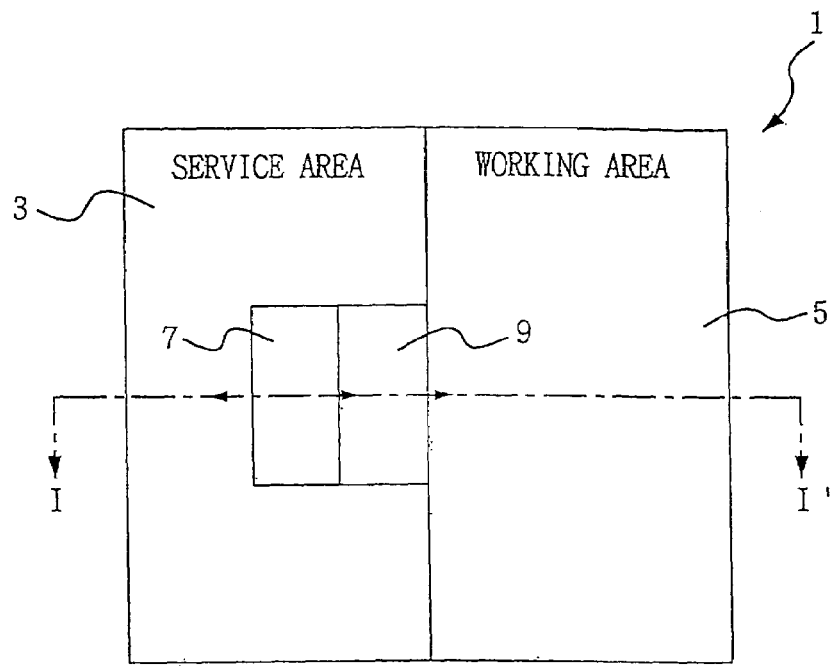
FIG. 1 is a plan view schematically illustrating a conventional clean room.
Figure 2:
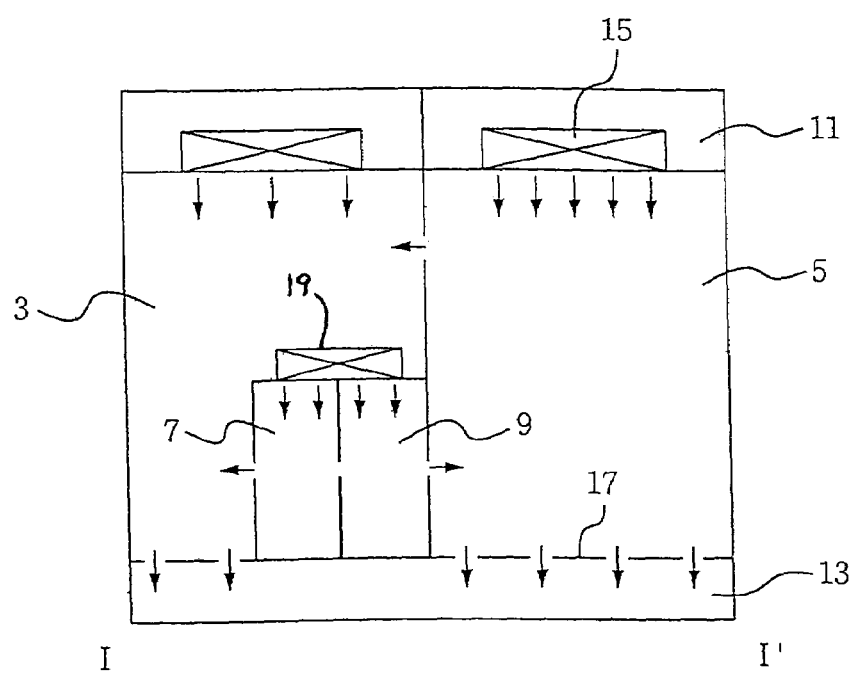
FIG. 2 is an elevation view taken along line I~I' of FIG. 1.
Figure 3:
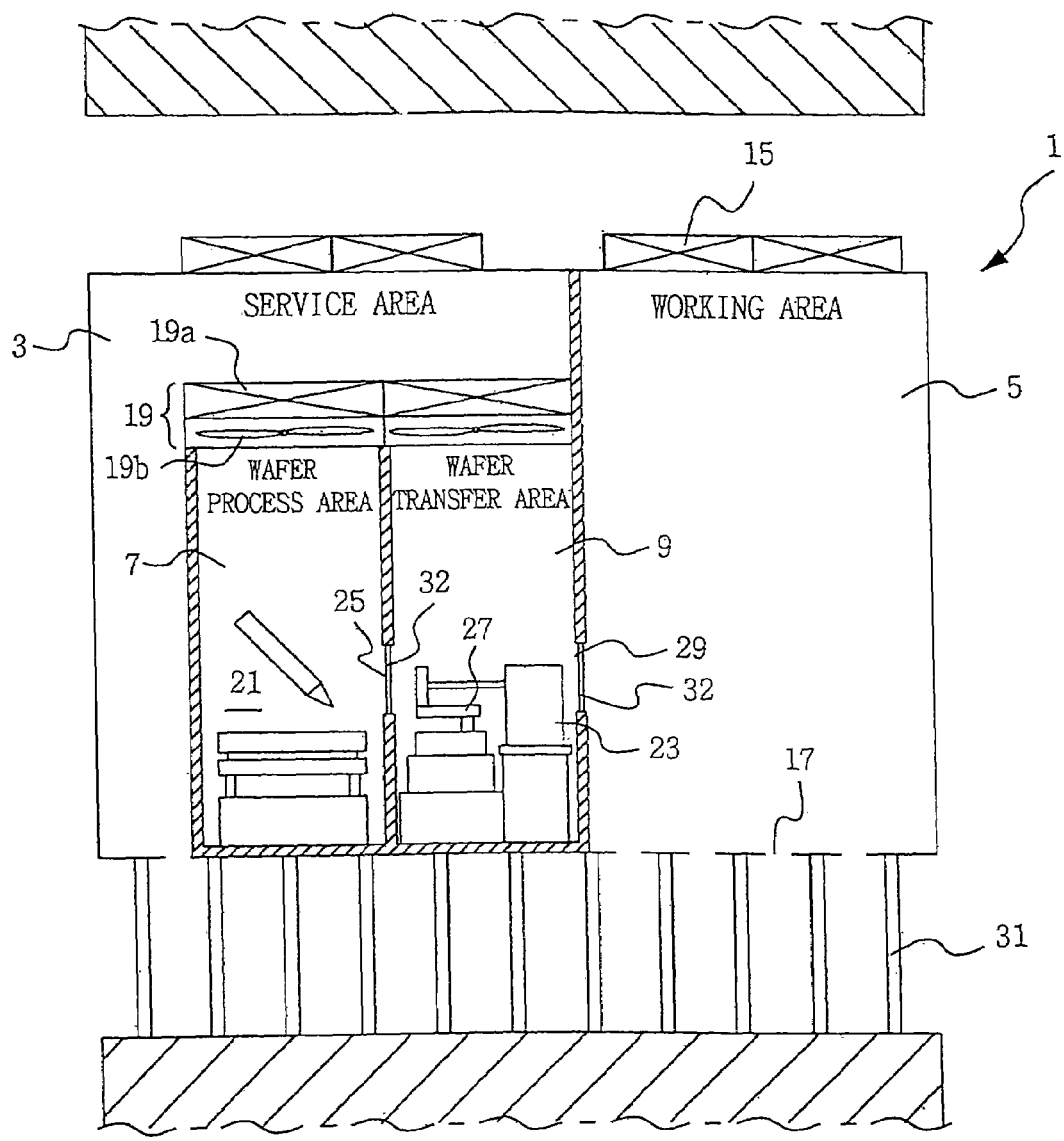
FIG. 3 illustrates more in detail a wafer process area and a wafer transfer area shown in FIG. 2.
Figure 4:
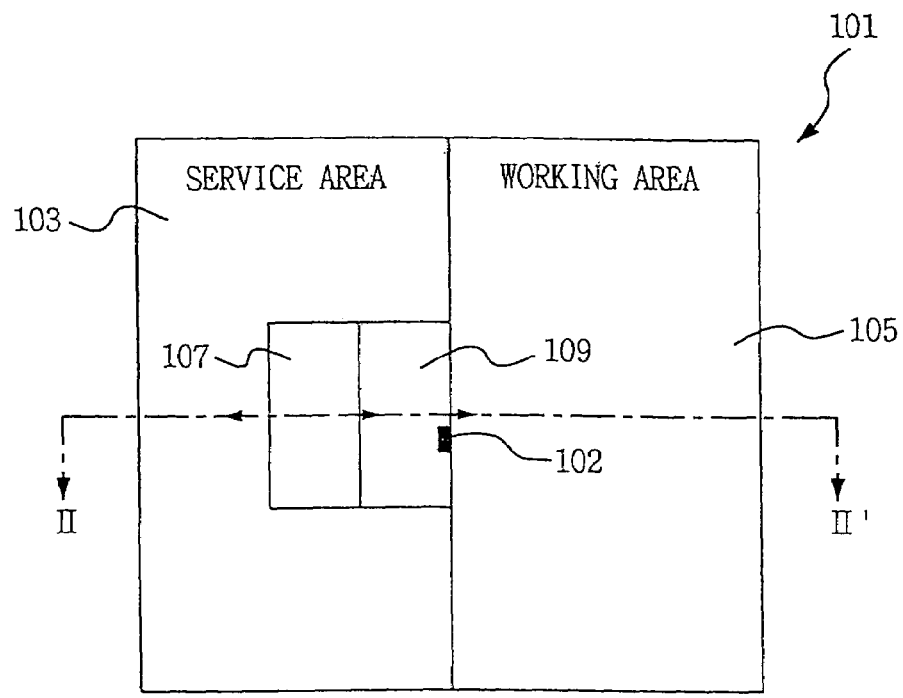
FIG. 4 is a plan view schematically illustrating a clean room according to one or more aspects of the invention.

FIG. 4 schematically illustrates a clean room.

Referring to FIG. 4, a clean room 101 is isolated from the outside to independently control the temperature and humidity therein. Because of the wafer manufacturing process performed in the clean room 101, clean air having a limited number of impurity or pollution particles circulates therein. The clean room 101 includes a working area 105 and a service area 103. A boat, having wafers mounted therein, is disposed inside the working area 105 and is moved therein by a worker or robot. The service area 103 contains a unit process region where semiconductor equipment is positioned for performing various processes on the wafer after it is returned from the working area 105.

The unit process region includes a wafer process area 107 for performing particular processes on the wafers, and a wafer transfer area 109 for loading and unloading the wafers to/from the wafer process area 107.

In the wafer transfer area 109, when the boat having the wafers mounted therein is moved by the worker from the working area 105 to the wafer transfer area 109, a robot of the wafer transfer area 109 loads the wafers from the boat onto the wafer process area 107 one by one. The robot of the wafer transfer area 109 loads the wafers on the wafer stage and also unloads the process-completed wafers from the wafer process area 107.

As mentioned above, since the semiconductor manufacturing process is actually performed in the wafer transfer area 109 and the wafer process area 107, air in the wafer transfer area 109 and the wafer process area 107 should have a higher degree of cleanliness (lower impurity particle count) as compared with the working area 105 and the service area 103. Clean air of the wafer transfer area 109 and/or the wafer process area 107 should flow to the service-area 103 and the working area 105.

Figure 5:
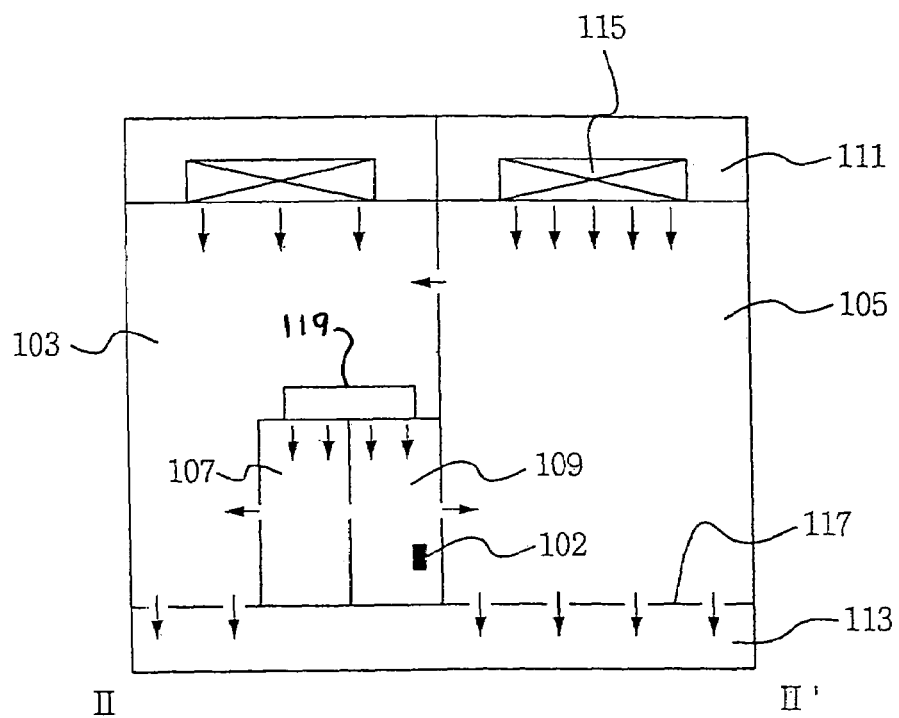
FIG. 5 is an elevation view taken along line II~II of FIG. 4.

Advantageously, in the system of FIG. 5 the degree of cleanliness (impurity particle count) air supplied to the wafer transfer area 109 and the wafer process area 107 is continuously measured by a particle measurer 102 installed in the wafer transfer area 109.

FIG. 5 is an elevation view taken along line II~II' line shown in FIG. 4.

Referring to FIG. 5, the clean room 101 includes an upper plenum 111, a lower plenum 113, an air supply device 119 and the particle measurer 102.

The upper plenum 111 is formed above the working area 105 and the service area 103 to supply thereto primarily purified clean air. The lower plenum 113 is provided in a lower portion of the clean room 101 opposite to the upper plenum 111, to collect air passed through the clean room 101. The air supply device 119 additionally (secondarily) purifies clean air supplied from the working area 105 and/or the service area 103, and supplies the purified air to the wafer process area 107 and the wafer transfer area 109. The particle measurer 102 is installed in the wafer transfer area 109 to continuously monitor the impurity or pollution particle count of the air in the wafer transfer area 109, thereby checking for any occurrence of a malfunction or defect in the air supply device 119.

The clean air supplied from the upper plenum 111 passes through a first air filter 115, and then passes through the working area 105 and the service area 103. Impurity particles generated in the working area 105 and the service area 103 are discharged together with the clean air through the lower plenum 113, under a low pressure. The upper and lower plenums 111, 113 of the clean room 101 are divided by the first air filters 115 and a grating 117 respectively. The first air filters 115 remove impurity particles from the air, and the grating 117 includes air holes through which air is passed. Though not shown in the drawing, air collected from the lower plenum 113 is recirculated back to the upper plenum 111.

The flow rate of clean air in the working area 105 and the service area 103 is mainly controlled by the size of the first air filter 115 and the number of gratings 117, the number of air holes, etc. The working area 105 is maintained and managed to have a greater degree of cleanliness (lower impurity particle count) than the service area 103. For example, when the number of impurity particles existing per unit volume of 1 $m^3$ is 1, it is called "a class 1 environment," and when the number of impurity particles per cubic meter is 1000, it is called "a class 1000 environment," etc. In that case, beneficially the working area 105 is a class 100 environment, while the service area 103 is a class 1000 environment.

The wafer process area 107 and the wafer transfer area 109 are closed without a discharging unit, such as the grating 117 that is provided in the working area 105. The discharging unit discharges the clean air supplied from the air supply device 119, thus the service area 103 and the working area 105 are maintained with a relatively high pressure. That is, the clean air supplied to the wafer process area 107 and the wafer transfer area 109 is dispersed to flow into the service area 103 and the working area 105.

This wafer process area 107 or wafer transfer area 109 is where an actual process for manufacturing wafers proceeds. In other words, the wafer process area 107 and the wafer transfer area 109 require a relatively high degree of air cleanliness as compared with the service area 103 or the working area 105. Beneficially, the wafer process area 107 and the wafer transfer area 109 are in the range of class 1 to class 10 environments.

Figure 6:
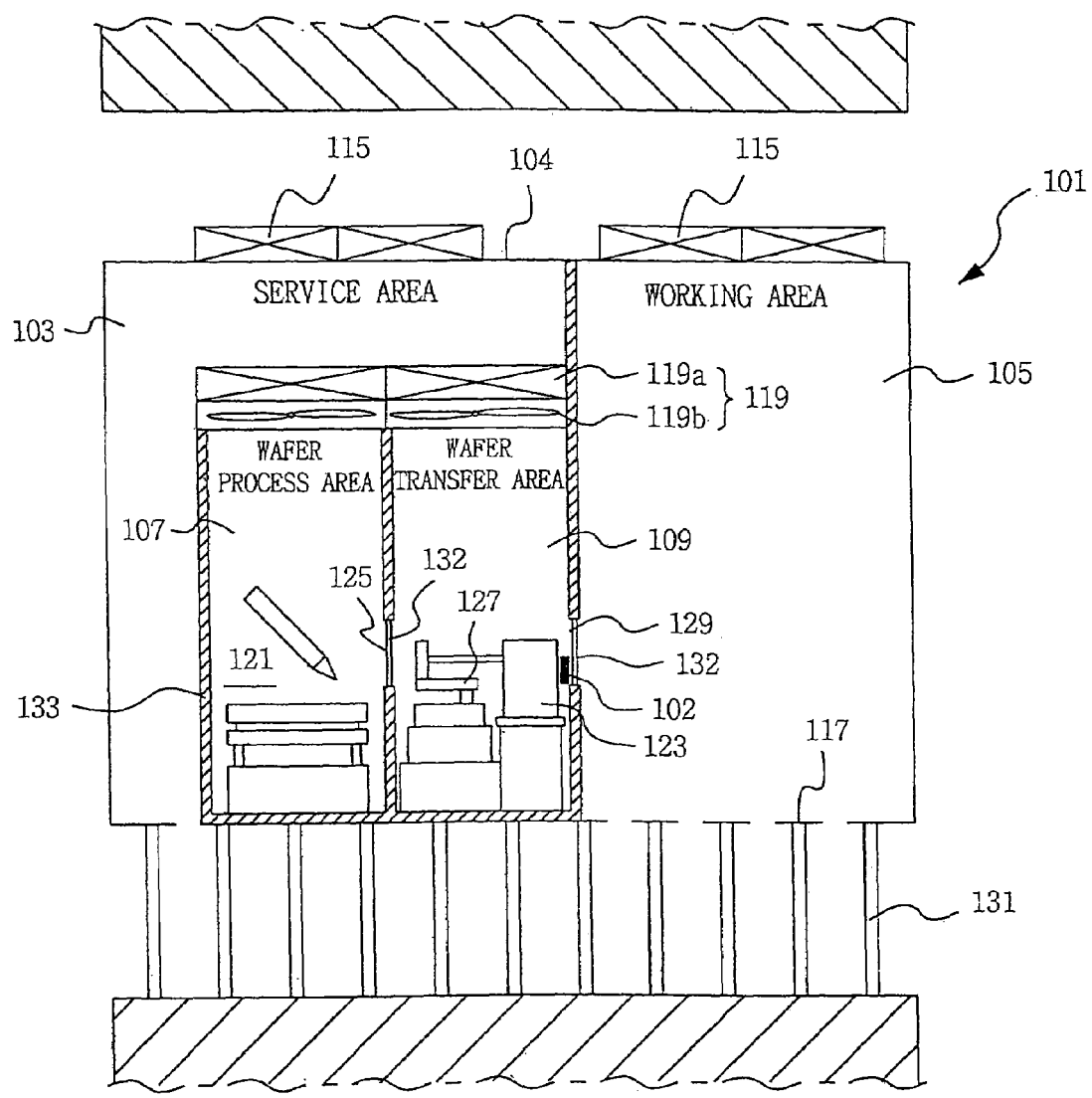
FIG. 6 illustrates more in detail a wafer process area and a wafer transfer area shown in FIG. 5.

FIG. 6 illustrates in greater detail the wafer process area 107 and the wafer transfer area 109 shown in FIG. 5.

Referring to FIG. 6, the service area 103 and the working area 105 are positioned in the clean room located between the upper plenum 111 and the lower plenum 113. The upper plenum 111 is segregated within the clean room 101 by a blind panel 104, and has a supply of clean air primarily purified by the first air filter 115 that is provided in the blind panel 104. Also the lower plenum 113 is formed in the bottom of the clean room 101 and segregated by the grating 117 having numerous air holes, and discharges air through the air holes. The grating 117 is supported by numerous pedestals 131 formed in the lower plenum 113. Thus the clean room 101 can be spatially independent.

The wafer transfer area 109 and the wafer process area 107, in which a unit process is performed, are provided within the service area 103. Clean air is supplied by the air supply device 119 formed above the wafer transfer area 109 and the wafer process area 107.

The air supply device 119 includes a second air filter 119a and an air blast 119b, such as a fan. The second air filter 119a performs an additional (secondary) purification of the air supplied from the service area 103 and/or the working area 105. The air blast 119b is provided to supply to the wafer process area 107, and the wafer transfer area 109, air having a higher pressure than the pressure of the air in the service area 103 and the working area 105, the air being purified by the second air filter 119a.

If the second air filter 119a requires replacement, or if there is a malfunction or a defect such as a breakdown of the air blast 119b, then the wafer process area 107 and the wafer transfer area 109 may be polluted, or air may reverse flow from the service area 103 and/or the working area 105 to the wafer process area 107 and/or wafer transfer area 109.

Accordingly, if the wafer transfer area 109 or the wafer process area 107 is contaminated by pollution particles due to a malfunction or defect of the air supply device 119, the particle measurer 102 not only senses the contamination of the wafer transfer area 109, but also provides an indication as to when it is time to change the filter.

Beneficially, an ion implantation device is installed in the wafer process area 107, and the wafer transfer area 109 is provided with a robot 127 for taking wafers from within the boat 123 transferred from the working area 105 and for loading the wafers into the wafer process area 107 through a wafer gate 125. The robot 127 not only loads of the wafers but also unloads and returns to the boat 123 the wafers completed in the ion implantation process.

The air supply device 119 sucks the clean air from an upper part of the service area 103 or the working area 105 near to the upper plenum 111, and then filters the clean air and supplies it to the wafer process area 107 and the wafer transfer area 109 under a uniform pressure.

The bottom of the wafer transfer area 109 and the wafer process area 107 is closed so that the air supplied from the air supply device 119 is not discharged to the lower plenum 113.

A boat gate 129 is provided between the wafer transfer area 109 and its adjacent working area 105 so that the boat 123 having the wafers mounted therein can pass therethrough. A wafer gate 125 is also provided between the wafer process area 107 and the wafer transfer area 109, to load and unload the wafers mounted in the boat 123. The boat gate 129 and the wafer gate 125 are each provided with a door 132.

The clean air of the wafer process area 107 and the wafer transfer area 109 is discharged to the working area 105 or the service area 103 through gaps formed in the respective doors of the boat gate 129 and the wafer gate 125.

The clean air of the wafer process area 107 and the wafer transfer area 109 supplied from the air supply device 119 is maintained at a high pressure within the closed space, thus much clean air is discharged through the gaps of the wafer gate 125 and the boat gate 129.

Furthermore, some clean air may be discharged through a micro-aperture or gap formed in a wall 133 between the wafer process area 107 and the service area 103. However, the clean air supplied to the wafer process area 107 and the wafer transfer area 109 flows mainly through the boat gate 129 formed between the wafer transfer area 109 and the working area 105.

The boat gate 129 is provided with the particle measurer 102 for sensing impurity particles in the air that may be generated in the wafer process area 107 and the wafer transfer area 109.

Because the clean air of the wafer process area 107 the wafer transfer area 109 is mainly discharged to the working area 105 through the boat gate 129, the particle measurer 102 can effectively sense any pollution particles generated in the wafer process area 107 and the wafer transfer area 109. Thereby, any contamination of the wafer process area 107 and the wafer transfer area 109 caused by a malfunction or defect of the air supply device 119 can be detected.

Additionally, if pollution is abnormally caused in the wafer transfer area 109, for example, impurity particles generated by the operation of the robot 127 installed in the wafer transfer area 109, the particle measurer 102 installed in the boat gate 129 can sense the pollution of the wafer transfer area 109.

Furthermore, if pollution of the wafer transfer area is abnormally caused by a malfunction or defect of the air supply device 119 or the operation of the robot 127, a process defect can be prevented by momentarily stopping the ion implantation process in response to the indication from the particle measurer 102.

The air cleaning system for semiconductor manufacturing equipment prevents a process defect caused by a defect of the air supply device 119, and thereby increases the production yield of the equipment.

In addition, the degree of cleanliness (impurity particle count) of the wafer transfer area 109 is measured automatically so as to increase the working efficiency and reduce the production cost.

Figure 7:
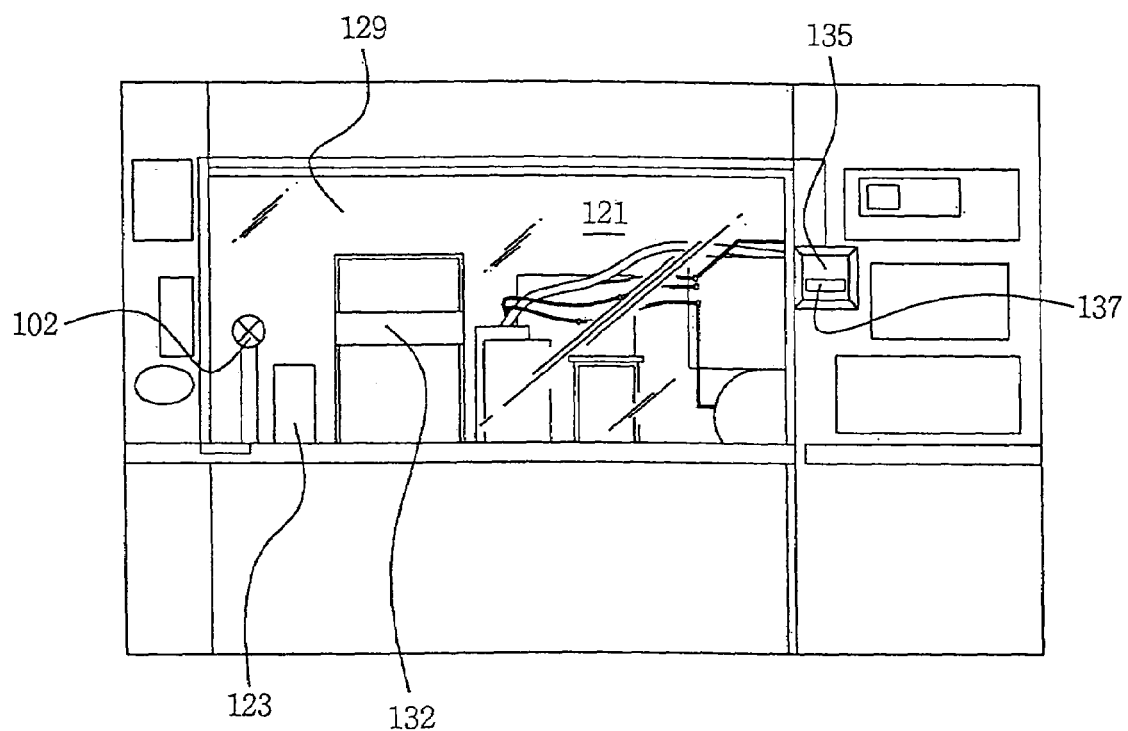
FIG. 7 is a front view of a wafer transfer area according to one or more aspects of the invention viewed from the side of the working area.

FIG. 7 is a front view of the wafer transfer area 109 viewed from the side of the working area 105.

As shown in FIG. 7, the cleaning system for the semiconductor manufacturing equipment includes the boat gate 129, the door 132, the particle measurer 102, and a particle measurer controller 135.

The boat gate 129 transfers the boat 123, in which numerous wafers are mounted, from the working area 105 to the wafer transfer area 109. The door 132 is adapted to perform a switching operation so as to cut off an air flow between the working area 105 and the wafer transfer area 109 in the boat gate 129, and is beneficially formed of a transparent glass or plastic material. The particle measurer 102 is installed within the boat gate 129 of the wafer transfer area 109, in which the door 132 is installed. The particle measurer controller 135 is installed in the working area 105 and controls the particle measurer 102.

The particle measurer controller 135 detects a pollution level of the wafer transfer area 109 by using an output signal of the particle measurer 102.

The particle measurer controller 135 may be provided with a display 137 for displaying a pollution level of the wafer transfer area 109, so as to provide an alarm or warning to a worker through the display 137.

If the pollution level indicates there are too many impurity particles in the wafer transfer area 109, a controller for the overall control of the semiconductor manufacturing equipment may momentarily stop a corresponding unit process by stopping the operation of the ion implantation device 121 of the wafer process area 107 and the operation of the robot 127 of the wafer transfer area 109.

Beneficially, the particle measurer 102 is installed in the boat gate 129 of the wafer transfer area 109, so that a pollution level, or particle count, in the wafer transfer area 109 and the wafer process area 107 is detected. If the pollution level is too great, a unit process such as the ion implantation process is stopped to exchange the second air filter 119a of the air supply device 119 and prevent the wafer transfer area 109 or the wafer process area 107 from contamination.

That is, as described above, the cleaning system for the semiconductor manufacturing equipment can monitor continuously in real time the pollution of the wafer process area 107 and the wafer transfer area 109 caused by a malfunction or defect, or by an abnormal particle generation of the air supply device 119, thereby increasing the yield and productivity of the equipment. A particle measurer is installed in a wafer transfer area, thereby monitoring a particle count or pollution level of the wafer transfer area under an unmanned or automated state, so as to reduce the production costs and increase the productivity.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, the configuration of the wafer process area 107 or the wafer transfer area 109 may be partially changed, or the number of particle measurers 102 installed in the wafer transfer area 109 may be increased. Accordingly, these and other changes and modifications are seen to be within the true spirit and scope of the invention as defined by the appended claims.

The invention claimed is:

1. A semiconductor manufacturing system, comprising:
    a working area; and
    a service area, the service area comprising:
        a wafer process area, in which a semiconductor manufacturing process is performed;
        a wafer transfer area spatially connected to the wafer process area, the wafer transfer area being adapted to transfer a wafer from the working area to the wafer process area;
        an air supply device for supplying clean air to the wafer transfer area and the wafer process area; and
        a particle measurer adapted to measure continuously an impurity particle count of air in the wafer transfer area.

2. The system of claim 1, further comprising:
a boat gate for transferring a boat in which numerous wafers are mounted from the working area to the wafer transfer area;
a door, which is provided with the boat gate and has a switching operation so as to isolate the working area from the wafer transfer area, and which comprises transparent glass or plastic material; and
a particle measurer controller for controlling the particle measurer.

3. The system of claim 2, wherein the particle measurer controller is provided in the working area.

4. The system of claim 2, wherein the particle measurer controller is provided with a display for displaying a particle impurity count of the air in the wafer transfer area.

5. The system of claim 4, wherein the display displays a warning when the air in wafer transfer area exceeds a fixed level.

6. The system of claim 1, wherein the air supply device comprises:
an air filter for purifying air of the service area or the working area; and
an air blast for supplying air purified by the air filter to the wafer process area or the wafer transfer area with a fixed pressure.

7. The system of claim 1, wherein the working area is about a class 100 environment.

8. The system as claimed in 1, wherein the service area is about a class 1000 environment.

9. The system as claimed in 1, wherein the wafer process area and the wafer transfer area are each about class 1 to class 10 environments.

10. The system of claim 1, wherein the particle measurer is provided in the wafer transfer area.

* * * * *